United States Patent [19]

Machida

[11] Patent Number: 4,857,847

[45] Date of Patent: Aug. 15, 1989

[54] METHOD AND SYSTEM FOR MAGNETIC RESONANCE IMAGING

[75] Inventor: Yoshio Machida, Tochigi, Japan

[73] Assignee: Kabushiki Kaisha Toshiba, Kawasaki, Japan

[21] Appl. No.: 95,775

[22] Filed: Sep. 14, 1987

[30] Foreign Application Priority Data

Sep. 18, 1986 [JP] Japan .................................. 61-220631

[51] Int. Cl.$^4$ ............................................ G01R 33/20
[52] U.S. Cl. ...................................... 324/311; 324/312
[58] Field of Search ............... 324/307, 308, 309, 312, 324/311

[56] References Cited

U.S. PATENT DOCUMENTS

| 4,716,368 | 12/1987 | Haacke ................................. 324/308 |
| 4,720,679 | 1/1988 | Patrick et al. ........................ 324/312 |
| 4,739,265 | 4/1988 | Yamamoto et al. ................. 324/309 |

OTHER PUBLICATIONS

"Simple Proton Spectroscopic Imaging[1]", W. Thomas Dixon, Ph.D., *Radiology*, 1984; 153: pp. 189–194.

*Primary Examiner*—Stewart J. Levy
*Assistant Examiner*—Kevin D. O'Shea
*Attorney, Agent, or Firm*—Foley & Lardner, Schwartz, Jeffery, Schwaab, Mack, Blumenthal & Evans

[57] ABSTRACT

The magnetic resonance (MR) imaging system, in which magnetic resonance is caused on the spin of a specific nucleus using a gradient field and a excitation pulse, and, through observation of an MR signal, an image representing the density distribution of that nucleus in a target region of a body is attained, provides at least one of a density distribution image of protons in water of the body and that of protons in the body's fat. First image data comprising complex image data representing the distribution of the spin in a water phantom and second image data comprising complex image data representing the spin distribution in the body are obtained. The first and second image data are acquired in the excitation sequence in which the phase of the MR signal for the water protons is opposite to that of the fat protons. By comparing the first and second image data, it is discriminated which one of the densities of water and fat protons in the second image data is dominant. Based on the discrimination result, the distortion component of the static field in the second image data is compensated for.

10 Claims, 3 Drawing Sheets

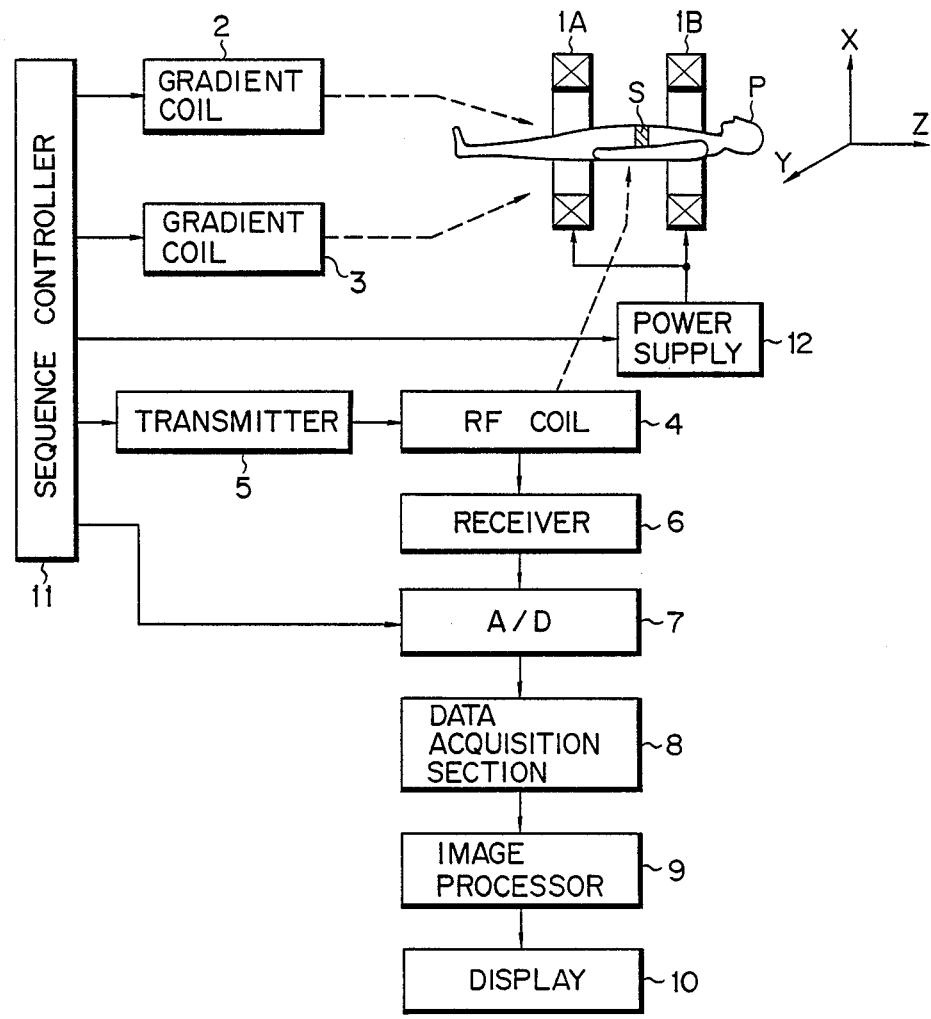
F I G. 2

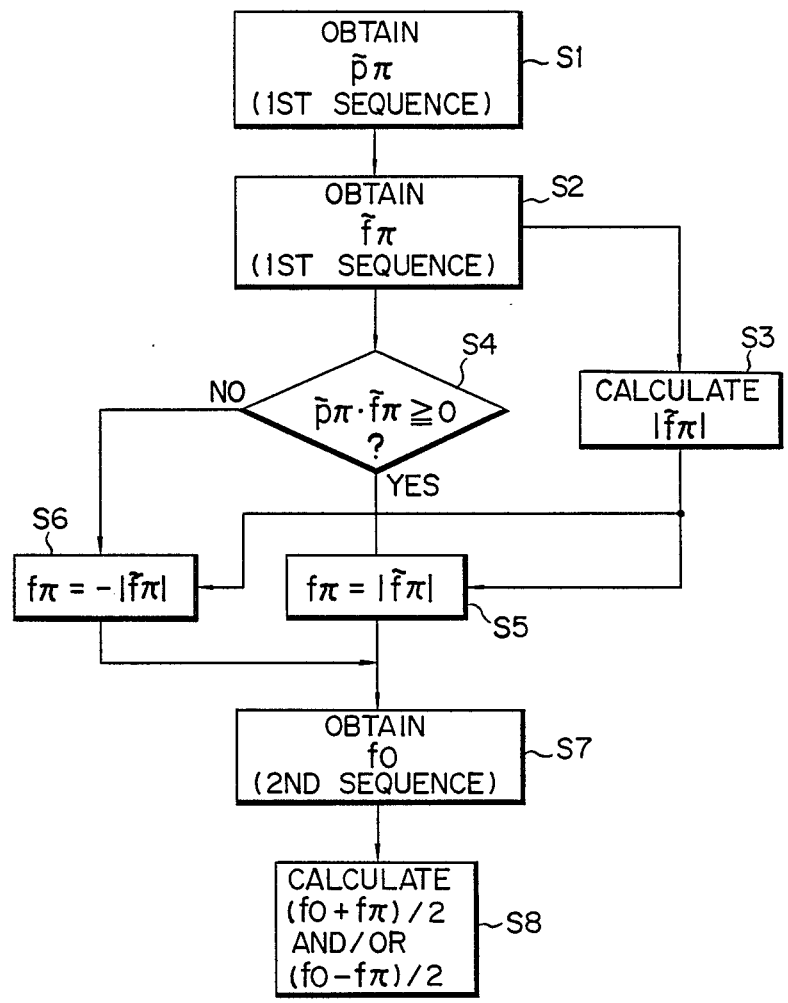
F I G. 3

METHOD AND SYSTEM FOR MAGNETIC RESONANCE IMAGING

BACKGROUND OF THE INVENTION

The present invention relates to a magnetic resonance (MR) imaging system which utilizes the MR phenomenon to noninvasively measure information about the density and relaxation time of a specific nucleus in a given region, for example, a slice, of a body under examination, thereby forming MR images useful for medical diagnosis, and more particularly, to a method and a system for MR imaging which separately provides MR images of water and fat of the body.

According to a typical MR imaging method for obtaining an MR image of hydrogen nuclei, i.e., protons, the complex image of protons in water and the complex image of protons in fat cannot be obtained separately and independently. However, with the use of the so-called chemical shift phenomenon (e.g., the protons in water and the protons in fat resonate at different frequencies, in the same magnetic field), the MR images of water and fat can separately be obtained. This type of imaging method for separating the MR image of water from that of fat is proposed in W. T. Dixon Radiology, page 153, by W. T. Dixon, 1984. A brief explanation of this method will be given below referring to FIG. 1.

As shown in FIG. 1, with a static field applied to a body under examination, a gradient field for slice determination (the static field and gradient field are not illustrated) and a $\pi/2$ pulse (90° pulse) are applied to the body, and after the elapse of the time $(T_E/2) - \Delta T$ from the application of $\pi/2$ pulse, the gradient field (not shown) for slice determination and a $\pi$ pulse (180° pulse) are applied to the body. After the elapse of time $T_E$ from the application of the $\pi/2$ pulse, an MR echo is observed. (A phase encoding gradient field or read gradient field may be used as desired.) In this case, the interval $\tau_1$ between the $\pi/2$ pulse and the $\pi$ pulse is $$\tau_1 = (T_E/2) - \Delta T$$

where $T_E$, the echo time, is the interval between the $\pi/2$ pulse and the MR echo, and the interval $\tau_2$ between the $\pi$ pulse and the MR echo is $$\tau_2 = (T_E/2) + \Delta T.$$

Thus, $$\tau_2 - \tau_1 = 2\Delta T.$$

With the chemical shift in water and fat protons being denoted as $\delta$, due to the time lag of $2\Delta T$, the water protons and the fat protons have a phase difference of:

$$\Delta \psi = \delta \gamma H_o (2\Delta T) \tag{1}$$

where $\gamma$ is a Larmor constant or gyromagnetic ratio, and $H_o$ is a static field intensity.

Now, let $\Delta T = \pi/(2\delta\gamma H_o)$, which yields $\Delta \psi = \pi$, and the phase of water is opposite to the phase of fat. Image data attained at this time, $f\pi$, is expressed as follows:

$$f\pi = f_W - f_F \tag{2}$$

where $f_W$ is water distribution information and $f_F$ is fat distribution information.

With image data $f_0$ attained in an ordinary imaging or at the time $\Delta T = 0$, the water protons are in phase with the fat protons. Thus $$f_0 = f_W + f_F \tag{3}$$

Adding equations (2) and (3) yields $f_W = (f_0 + f\pi)/2$, and subtracting equation (2) from equation (3) yields $f_F = (f_0 - f\pi)/2$.

The above is a summary of the imaging method proposed by W. T. Dixon.

Let us now consider the inhomogeneity of the static field. This inhomogeneity in the MR imaging, which varies depending on the size or state of an image pickup region, is considered to be several ppm or less when a body under examination by a typical system is a human body. This inhomogeneity can be expressed by $\Delta H$ that is a function of spatial positions or coordinates (x,y,z). Since the chemical shift $\delta$ corresponds to about 3.5 ppm, the inhomogeneity $\Delta H$ is nearly equal to the chemical shift or greater in some cases. Due to the inhomogeneity of the static field, therefore, an image is distorted. This distortion is called a static field distortion. The image data $f\pi(x,y)$ actually includes the influence of the inhomogeneity $\Delta H$. This actual image data $\bar{f}\pi(x,y)$ that includes the influence of $\Delta H$ is expressed as:

$$\bar{f}\pi(x,y) = e^{i\gamma \Delta H(x,y) \cdot 2\Delta T}(f_W(x,y) - f_F(x,y)) \tag{4}$$

In equation (4), (x,y) means the position of the coordinate system which is properly determined on a plane including the target slice. Since the inhomogeneity $\Delta H$ of the static field depends on the spatial positions as mentioned earlier, different influences would appear on a reconstructed image, depending on the pixels. In the Dixon report, the absolute value of a complex number of actual image data $\bar{f}\pi$, namely $|f_W - f_F|$, is obtained and is used for $f_W - f_F$. In this case, it is not distinguished whether $f_W$ is greater or smaller than $f_F$, so that the static field distortion cannot be correctly compensated. This static field distortion $\Delta H(x,y)$ may be compensated as follows:

The image of a water phantom is picked up in advance in the sequence with $\Delta T = \pi/(2\delta\gamma H_o)$ as is done to attain $\bar{f}\pi$, and its image data is denoted by $\bar{p}\pi(x,y)$, which is expressed as follows:

$$\bar{p}\pi(x,y) = e^{i\gamma \Delta H(x,y) \cdot 2\Delta T} p_o(x,y) \tag{5}$$

In equation (5), $p_o(x,y)$ is the image data of the water phantom when $\Delta T = 0$. (As should be clear from equation (4), the image data attained when $\Delta T = 0$ is not influenced by the inhomogeneity $\Delta H$ of the static field.) And, $$f\pi(x,y) = \frac{\bar{p}\pi(x,y)}{|\bar{p}\pi(x,y)|} \cdot \bar{f}\pi(x,y) \tag{6}$$

As $f\pi(x,y)$ in equation (6) is equal to $f_W(x,y) - f_F(x,y)$, the static distortion can be compensated.

However, to carry out this compensation, it is necessary to use sufficiently accurate compensating image data $\bar{p}\pi$. Since the calculation using such accurate data is complicated to perform, it requires a very long time. Therefore, the compensation for the field by the above method is not practical.

Neglecting the static field distortion, separate image data of water and fat of a quality suitable for medical diagnosis cannot be attained.

SUMMARY OF THE INVENTION

With the above in mind, it is an object of this invention to provide a method and a system for magnetic resonance imaging, which can compensate for a static field distortion quickly and properly so as to quickly provide separate water and fat images of a quality suitable for medical diagnosis.

The magnetic resonance (MR) imaging system of this invention, in which magnetic resonance is caused on the spin of a specific nucleus using a static field, a gradient field and an excitation pulse, and, through observation of an MR signal, an image representing the density distribution of that nucleus in a target region of a body under examination is attained, provides at least one of the density distribution image of protons in water of the body and that of protons in the body's fat. Complex image data $\bar{p}\pi$ representing the distribution of the magnetic resonance in a water phantom and complex image data $\bar{f}\pi$ representing the magnetic resonance distribution in the body are obtained. The image data $\bar{p}\pi$ is acquired in the first excitation sequence where the phase of the MR signal for the water protons is opposite to that of the fat protons, and the image data $\bar{f}\pi$ is also acquired in the first excitation sequence. By comparing the image data $\bar{p}\pi$ and $\bar{f}\pi$, it is discriminated which one of the densities of water and fat protons is dominant. Based on the discrimination result, the distortion component of the static field in the image data is compensated for.

The first excitation sequence is typically such that a $\pi/2$ pulse (90° pulse) is applied to the body first, and after an elapse of time $(T_E/2) - \Delta T$, where $T_E$ is the echo time, a $\pi$ pulse (180° pulse) is applied to the body.

According to a typical system to which the present invention is applied, comparison and discrimination of the MR image data $\bar{p}\pi$ of a water phantom and the MR image data $\bar{f}\pi$ of the body are executed by obtaining the real two-dimensional inner product of $\bar{p}\pi$ and $\bar{f}\pi$ and then discriminating the sign (plus or minus) of the product. The distortion of $\bar{f}\pi$ is compensated for by determining the sign of $|\bar{f}\pi|$ in accordance with the discriminated sign.

The MR image data $f_W$ and $f_F$ of water and fat are separately attained by applying the Dixon method to the compensation result $f\pi$ and the image data $fo$ obtained in the second excitation sequence.

The second excitation sequence is typically such that a $\pi/2$ pulse is applied to the body first, and after an elapse of time $(T_E/2)$, a $\pi$ pulse is applied to the body.

According to the MR imaging system of this invention, by comparing the image data $\bar{p}\pi$ of a water phantom obtained in the first excitation sequence and the image data $\bar{f}\pi$ of the body obtained in the first excitation sequence, it is discriminated which density of protons in the image data $\bar{f}\pi$, the density of water protons or that of fat protons, is dominant. In accordance with the discrimination result, the static field distortion of $\bar{f}\pi$ is compensated for. The comparison and discrimination are simply executed by only discriminating the sign of the real two-dimensional inner product, thus shortening the calculation time. Further, since the compensation is executed only by the sign discrimination and the inhomogeneity of the static field is not excessively localized, the data $p\pi$ used for the compensation could be coarse. From the compensation result $f\pi$ and the body's MR image $fo$ obtained in the second excitation sequence, the MR images of water and fat of the body are separately formed. This imaging system can quickly compensate for the static field distortion and quickly provide separate water and fat images suitable for medical diagnosis.

BRIEF DESCRIPTION OF THE CONVENTIONAL DRAWINGS

FIG. 2 is a block diagram of an MR imaging system according to an embodiment of this invention; and FIG. 3 is a flowchart for explaining the processes carried out in the system of FIG. 2.

DETAILED DESCRIPTION OF THE PREFERRED EMBODIMENT

Figure 1:
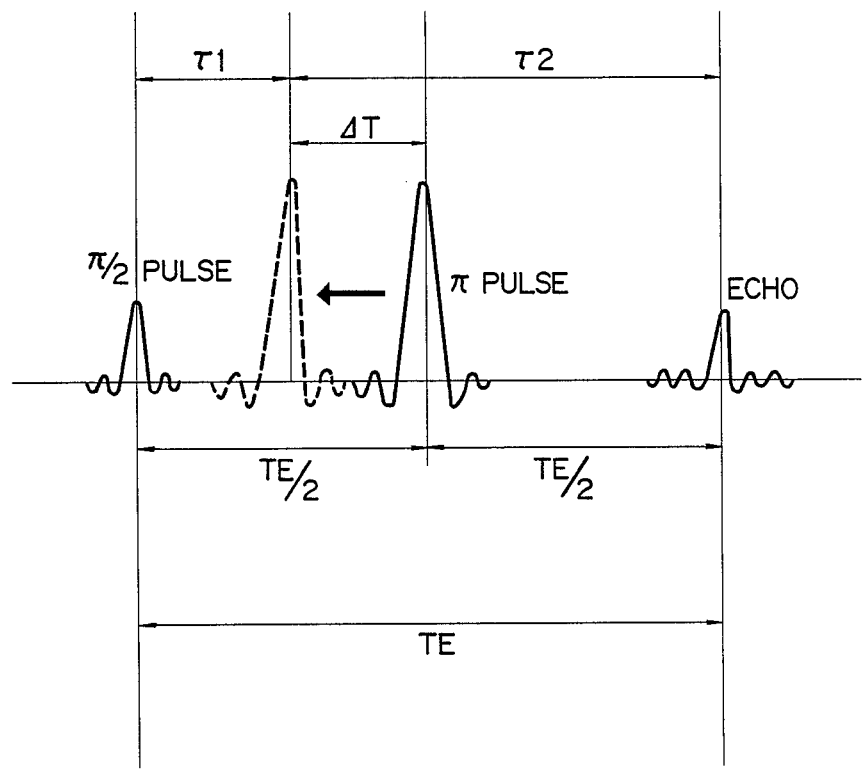
FIG. 1 is a diagram for explaining the excitation sequence of an MR imaging system.

An MR imaging system according to an embodiment of this invention will now be explained with reference to the accompanying drawings.

To begin with, the principle of the imaging of this system will be explained.

According to the aforementioned Dixon method, the body's MR image data $f\pi = f_W + f_F$ ($f_W$:water component and $f_F$:fat component) that is obtained in the pulse sequence in which the $\pi/2$ pulse is applied to the body and after an elapse of time $(T_E/2) - \Delta T$, the $\pi$ pulse is then applied to the body (this pulse sequence is referred to as the first excitation sequence for the sake of explanation) is actually influenced by the static field distortion $\Delta H(x,y)$. The present system compensates for this distortion in the following manner.

In consideration of the static field distortion the absolute value of the complex image data in $\bar{f}\pi$ of the body's MR information obtained in the first excitation sequence is expressed by the equation below.

$$|\bar{f}\pi(x,y)| = |e^{i\gamma \Delta H(x,y) \cdot (2\Delta T)} (f_W(x,y) - f_F(x,y))| \qquad (7)$$
$$= |f_W(x,y) - f_F(x,y)|$$

Therefore, if the sign of this image data alone is obtained, $f_W(x,y) - f_F(x,y)$ can be obtained.

To do so, first, an image pick-up is executed by the first excitation sequence, thereby providing the complex image data $\bar{p}\pi(x,y)$ of the MR information of a water phantom. Then, another image pick-up is executed through the first excitation sequence, thereby providing the complex image data $\bar{f}\pi(x,y)$ of the body's MR information. Then, the real two-dimensional inner product of the image $\bar{p}\pi(x,y)$ and $\bar{f}\pi(x,y)$, $\bar{f}\pi(x,y) \cdot \bar{p}\pi(x,y)$, obtained, and the sign of this inner product is discriminated. Based on the discrimination result and using the absolute value $|\bar{f}\pi(x,y)|$ of the complex image data $\bar{f}\pi(x,y)$, the static field distortion is compensated for. To be specific, if $$\bar{f}\pi(x,y) \cdot \bar{p}\pi(x,y) \geq 0, \qquad (8)$$

$|\bar{f}\pi(x,y)|$ is taken as $f\pi(x,y)$, and if $$\bar{f}\pi(x,y) \cdot \bar{p}\pi(x,y) < 0, \qquad (9)$$

$-|\bar{f}\pi(x,y)|$ is taken as $f\pi(x,y)$. In this manner, the correct $f_W(x,y) - f_F(x,y)$ can be attained. In equations (8) and (9), "·" indicates the ordinary inner product with the complex data $\bar{f}\pi$ and $\bar{p}\pi$ considered as real two-dimensional data.

The above-described compensation is simply executed by only discriminating the sign of the real two-dimensional inner product, thus shortening the time required for the compensation. In addition, since the image data $p\pi$ used for the compensation is used only to determine the sign, the phase difference between this data and the real data can be allowed up to $\pm 90°$. Therefore, the image data $\bar{p}\pi$ used for the compensation, even when very coarsely measured, can permit sufficiently effective compensation.

Then, the MR image of the body is picked up in the excitation sequence in which the $\pi/2$ pulse is applied to the body and after an elapse of time $T_E/2$, the $\pi$ pulse is applied to the body (this excitation sequence is a sequence ordinarily used in a spin echo method, and will be referred to as the second excitation sequence for the sake of explanation).

From the body's MR image data fo obtained in the second excitation sequence and the MR image data $f\pi$ obtained by the compensation, images for water and fat are separately attained. This separation is easily performed using the aforementioned Dixon method. That is, from $(fo+f\pi)/2$ and $(fo-f\pi)/2$, the image $f_W$ for water and the image $f_F$ for fat are attained.

To reiterate, the MR image data $\bar{p}\pi$ of a water phantom is formed in the first excitation sequence and based on the sign of the real two-dimensional inner product of this image data $p\pi$ and the body's MR image data $f\pi$ obtained in the first excitation sequence, the static field distortion originated from the inhomogeneity of the static field is compensated. As a result, this distortion compensation is executed at high speed and this compensation permits separate water and fat images sufficient for medical diagnosis to be attained quickly. In addition, since the image data $\bar{p}\pi$ of the water phantom used for the compensation is used only to determine the sign, the phase difference between this data and the real data can be allowed up to $\pm 90°$. Therefore, the image data $\bar{p}\pi$ used for the compensation could be coarse. For instance, the compensation data for the image data for a $256 \times 256$ matrix can be $32 \times 32$ or $16 \times 16$ matrix data. Furthermore, as an MR image of an arbitrary cross section of the body can be obtained in the MR imaging, the compensation data may be stored three-dimensionally in order to cope with such imaging. Since the compensation data may be coarse, even if this data is stored three-dimensionally, the amount of stored data would not be significantly increased. Accordingly, the compensation technique is practical with respect to the memory capacity. Furthermore, since the allowable range of the phase difference between the compensation data and the real data is large, even when the static field distortion pattern varies due to a chronological change in the static field, for example, the compensation data can be used for a long period of time without attaining the data again. In this respect, therefore, the aforementioned compensation is practical.

An MR imaging system according to an embodiment of this invention, which operates based on the above-described principle, is illustrated in FIG. 2.

This system comprises static field coils 1A and 1B, gradient coils 2 and 3, RF (radio frequency) coil 4, transmitter 5, receiver 6, A/D (analog-to-digital) converter 7, data acquisition section 8, image processor 9, display 10, sequence controller 11 and power supply 12.

The static field coil pair 1A and 1B are driven by power supply 12 and produce a homogeneous static field that is applied to a body under examination P. The first gradient coil 2 generates a gradient field in the direction of the Z axis, which is applied to body P to determine the position of slice S of body P. The second gradient coil 3 generates gradient fields in given directions on the X-Y plane, namely read and encoding gradient fields, which are applied to body P. Rf coil 4, which is driven by transmitter 5, applies the $\pi/2$ pulse and $\pi$ pulse to body P at the respective given timings and detects the MR echo (spin echo) produced in body P and gives the echo to receiver 6. Receiver 6 rectifies the MR echo signal detected through RF coil 4, by means of a phase detector, such as a quadrature detector. A/D converter 7 converts the MR echo signal detected and extracted by receiver 6 into digital data and supplies the digital data to data acquisition section 8. Data acquisition section 8 acquires and stores the MR data supplied through A/D converter 7. Image processor 9 subjects the MR data acquired in data acquisition section 8 to a given process so as to provide an MR image. Image processor 9 performs a comparison (inner product) of the MR image data of the water phantom and the body P picked up in the first excitation sequence, discrimination of the comparison result, compensation of the body's MR image data using this discrimination result, and calculation of image data for water and fat using the compensated data and the body's MR image data picked up in the second excitation sequence.

Display 10 displays images based on the MR image data produced in image processor 9, which include separated water and fat images. Sequence controller 11 properly controls gradient coils 2 and 3, transmitter 5, A/D converter 7 and power supply 12 so as to acquire excitation data and resonance data of magnetic resonance in accordance with a given sequence including the first and second excitation sequences.

The operation of providing separate water and fat images in this system will now be explained referring to the flowchart shown in FIG. 3.

First, a water phantom is set in an image pick-up region, and static coils 1A and 1B, gradient coils 2 and 3 and RF coil 4 are energized under the control of sequence controller 11 and in accordance with the first excitation sequence, causing the magnetic resonance. The MR data is acquired in data acquisition section 8 through RF coil 4, receiver 6 and A/D converter 7, and the acquired MR data is processed in image processor 9 to provide complex image data $\bar{p}\pi$ of the MR information of the water phantom (step S1).

The body is situated in the image pick-up region, and the complex image data $\tilde{f}\pi$ of the body's MR information is obtained in image processor 9 in the same operation as is mentioned above, which uses the first excitation sequence ($\Delta T = 0$) (step S2).

From the complex image data $\tilde{f}\pi$ of the body attained in step S2, its absolute value $|\tilde{f}\pi|$ is calculated (step S3).

The real two-diemsnional inner product $\bar{p}\pi \cdot \tilde{f}\pi$ of the complex image data $\bar{p}\pi$ of the water phantom obtained in step S1 and the complex data $\tilde{f}\pi$ of the body obtained in step S2 is acquired and its sign is determined (step S4).

When the sign determined in step S4 is positive, $|\tilde{f}\pi|$ attained in step S3 is used as $f\pi$ (step S5). When the sign determined in step S4 is negative, $|\tilde{f}\pi|$ attained in step S3 is changed to $-|\tilde{f}\pi|$ and is used as $f\pi$ (step S6).

The body is situated in the image pick-up region, and static coils 1A and 1B, gradient coils 2 and 3 and RF coil 4 are energized under the control of sequence controller 11 and in accordance with the second excitation sequence ($\Delta T = 0$), causing the magnetic resonance. The MR data is acquired in data acquisition section 8 through RF coil 4, receiver 6 and A/D converter 7, and the acquired MR data is processed in image processor 9 to provide image data fo of the ordinary MR information of the body, which does not include the influence of the chemical shift (step S7).

From the image data $f\pi$ attained in steps S5 and S6 and the image data fo attained in step S7, water image data $f_W$ and fat image data $f_F$ are calculated as $(fo+f\pi)/2$ and $(fo-f\pi)/2$, respectively (step S8).

The steps S3 to S6 and S8 are executed in image processor 9.

The water image data $f_W$ and/or fat image data $f_F$ attained in step S8 are displayed on display 10.

In the above description, this invention has been explained with reference to a particular embodiment. It is needless to say, however, that this invention is not limited to that embodiment but may be modified in various manners within the scope of the invention.

For instance, since the image pick-up executed in steps S1, S2 and S7 of FIG. 3 needs to be done until the image data is subjected to a calculation, the order or the timing of carrying out these steps can be changed from what is illustrated in FIG. 3, as long as the calculation using the resultant data is not adversely affected.

The image data $\bar{p}\pi$ of the water phantom attained in step S1 is used as compensation data to compensate for field distortion, as already described, and its accuracy or resolution could be low. Accordingly, the image pick-up of the image data $\bar{p}\pi$ of the water phantom in step S1 should not necessarily be executed for each image pick-up of the body in step S2. As long as the field distortion is sufficiently small an error in the attained image does not significantly increase so that the previously attained data can be used. Therefore, the image pick-up of the image data $\bar{p}\pi$ needs to be executed for a relatively long predetermined period.

What is claimed is:

1. In a magnetic resonance imaging system, in which magnetic resonance is caused on a spin of a specific nucleus using a static field, a gradient field and an excitation pulse, and, through observation of a magnetic resonance signal, an image representing the density distribution of said specific nucleus in a target region of a body under examination is attained, in order to separately obtain at least one of a density distribution image of protons in water of said body and that of protons in fat of said body, a magnetic resonance imaging method comprising:

a first step of using a first excitation sequence in which a phase of a magnetic resonance signal of water protons is opposite to a phase of a magnetic resonance signal of fat protons, so as to provide first image data comprising complex image data indicating a density distribution of magnetic resonance of protons in a water phantom;

a second step of using said first excitation sequence to provide second image data comprising complex image data indicating a density distribution of magnetic resonance of protons in said body;

a third step of providing third image data comprising absolute value image data indicating a density distribution of magnetic resonance of protons in said body, from said second image data obtained in said second step;

a fourth step of discriminating a sign of a real two-dimensional inner product of said first and second image data obtained in said first and second steps, respectively;

a fifth step of applying sign data obtained in said fourth step to said third image data obtained in said third step, so as to provide fourth image data comprising complex image data indicating a density distribution of protons in said body, which has been subjected to compensation for static field distortion;

a sixth step of using a second excitation sequence in which a magnetic resonance signal of water protons is in phase with a magnetic resonance signal of fat protons, so as to provide fifth image data comprising complex image data indicating a density distribution of magnetic resonance of protons in said body; and a seventh step of providing, from said fourth image data obtained in said fifth step and said fifth image data obtained in said sixth step, at least one of sixth and seventh image data respectively indicating density distributions of water and fat protons in said body, through an analyzing process involving a chemical shift of magnetic resonance.

2. The method according to claim 1, wherein said first excitation sequence used in said first and second steps is such that a $\pi/2$ pulse is applied, as an excitation pulse, to said body, and after elapse of time $(T_E/2)-\Delta T$, where $T_E$ is an echo time from a point of time at which a first excitation pulse is applied to said body to a point of time at which a magnetic resonance echo is generated, a $\pi$ pulse is applied to said body.

3. The method according to claim 2, wherein $\Delta T=\pi/2\delta\gamma Ho$, where $\delta$ is a chemical shift of water and fat protons, $\gamma$ is a gyromagnetic ratio and Ho is a static field intensity.

4. The method according to claim 1, wherein said second excitation sequence used in said sixth step is such that a $\pi/2$ pulse is applied, as an excitation pulse, to said body, and after an elapse of time $(T_E/2)$, where $T_E$ is an echo time from a point of time at which a first excitation pulse is applied to said body to a point of time at which a magnetic resonance echo is generated, a $\pi$ pulse is applied to said body.

5. The method according to claim 1, wherein with said fourth image data denoted by fo and said fifth image data denoted by $f\pi$, image data of water and image data of fat are actually obtained by calculating $(fo+f\pi)/2$ and $(fo-f\pi)/2$, respectively.

6. In a magnetic resonance imaging system, in which magnetic resonance is caused on a spin of a specific nucleus using a static field, a gradient field and an excitation pulse, and, through observation of a magnetic resonance signal, an image representing a density distribution of said specific nucleus in a target region of a body under examination is attained, in order to provide at least one of a density distribution image of water protons in said body and that of fat protons in said body, a magnetic resonance imaging method comprising the steps of:

comparing first image data comprising first complex image data indicating a magnetic resonance distribution in a water phantom, said complex first image data being acquired in a first excitation sequence in which a phase of a magnetic resonance signal for water protons is opposite to that of said magnetic resonance signal for fat protons, with second image data comprising second image data indicating a magnetic resonance distribution in said body, said second complex image data being acquired in said first excitation sequence, thereby discriminating which one of densities of said water and fat protons is dominant;

correcting a distortion component of said static field in said second image data based on the discrimination result, thereby obtaining third image data comprising third complex image data indicating a density distribution of protons in said body; and providing at least one of fourth and fifth image data, respectively, indicating density distributions of water and fat protons in said body, by processing said third image data and sixth image data, said sixth image data comprising fourth complex image data indicating a density distribution of magnetic resonance of protons in said body, said fourth complex image data being acquired in a second excitation sequence in which a magnetic resonance signal for water protons is in phase with a magnetic resonance signal of fat protons.

7. A magnetic resonance imaging system comprising:

excitation means for selectively using a first excitation sequence in which a phase of a magnetic resonance signal of water protons is opposite to a phase of a magnetic resonance signal of fat protons, and a second excitation sequence in which said magnetic resonance signal of said water protons is in phase with said magnetic resonance signal of said fat protons, and for applying a static field, a gradient field and an excitation pulse to a body under examination in accordance with a selected excitation sequence, thereby causing magnetic resonance on a spin of a proton in a specific region of said body;

data acquisition means for receiving a magnetic resonance signal originated from said magnetic resonance caused by said excitation means and acquiring magnetic resonance data;

imaging means for attaining an image indicating a resonance density distribution of said proton in a target region of said body from said magnetic resonance data acquired by said data acquisition means;

control means for: (1) operating said excitation means in said first excitation sequence, so as to cause said imaging means to provide first image data comprising complex image data indicating a density distribution of magnetic resonance of protons in a water phantom;

(2) operating said excitation means in said first excitation sequence so as to cause said imaging means to provide second image data comprising complex image data indicating a density distribution of magnetic resonance of protons in said body; and (3) operating said excitation means in said second excitation sequence, so as to cause said imaging means to provide third image data comprising complex image data indicating a density distribution of magnetic resonance of protons in said body;

discrimination means for discrimination a sign of a real two-dimensional inner product of said first and second image data; and image processing means for: (1) providing fourth image data comprising absolute value image data indicating a density distribution of magnetic resonance of protons in said body, from said second image data; (2) applying sign data obtained by said discrimination means to said fourth image data, so as to provide fifth image data comprising complex image data indicating a density distribution of protons in said body, which has been subjected to compensation for static field distortion; and (3) providing, from said fifth image data and said third image data, at least one of sixth and seventh image data respectively indicating density distributions of water and fat protons in said body, through an analyzing process involving a chemical shift of magnetic resonance.

8. The system according to claim 7, wherein said first excitation sequence is such that a $\pi/2$ pulse is applied, as an excitation pulse, to said body, and after elaspe of time $(T_E/2) - \Delta T$, where $T_E$ is an echo time from a point of time at which a first excitation pulse is applied to said body to a point of time at which a magnetic resonance echo is generated, a $\pi$ pulse is applied to said body, and wherein said second excitation sequence is such that a $\pi/2$ pulse is applied, as an excitation pulse, to said body, and after elapse of time $(T_E/2)$, a $\pi$ pulse is applied to said body.

9. The system according to claim 8, wherein $\Delta T = \pi/2\delta\gamma Ho$, where $\delta$ is a chemical shift of water and fat protons, Y is a gyromagnetic ratio and Ho is a static field intensity.

10. The system according to claim 7, wherein with said fourth image data denoted by fo and said fifth image data denoted by f$\pi$, said third image processing means actually provides image data of water and image data of fat by calculating (fo+f$\pi$)/2 and (fo−f$\pi$)/2, respectively.

* * * * *